United States Patent [19]

Iwasaki

[11] Patent Number: 5,759,879
[45] Date of Patent: Jun. 2, 1998

[54] METHOD FOR FORMING POLYCRYSTALLINE SILICON FILM AND METHOD FOR FABRICATING THIN-FILM TRANSISTOR

[75] Inventor: Yasunori Iwasaki, Tenri, Japan

[73] Assignee: Sharp Kabushiki Kaisha, Osaka, Japan

[21] Appl. No.: 611,406

[22] Filed: Mar. 6, 1996

[30] Foreign Application Priority Data

Apr. 10, 1995 [JP] Japan ................................ 7-084373

[51] Int. Cl.⁶ .................................................... H01L 21/84
[52] U.S. Cl. ................................ 438/166; 117/7; 117/9
[58] Field of Search ........................ 117/7–9; 438/149, 438/166, 155, 201, 184

[56] References Cited

U.S. PATENT DOCUMENTS

| 4,381,202 | 4/1983 | Mori et al. ............................. 438/166 |
| 4,933,298 | 6/1990 | Hasagawa ............................. 438/166 |
| 5,531,182 | 7/1996 | Yonehara .............................. 117/7 |
| 5,549,747 | 8/1996 | Bozler et al. ......................... 117/43 |
| 5,637,515 | 6/1997 | Takamura ............................. 438/162 |
| 5,639,698 | 6/1997 | Yamazaki et al. ..................... 117/8 |

FOREIGN PATENT DOCUMENTS

| 2-143414 | 6/1990 | Japan. |
| 4-367217 | 12/1992 | Japan. |
| 4-367218 | 12/1992 | Japan. |

OTHER PUBLICATIONS

Asano et al, Extended Abstracts of the 1993 International Conference on Solid State Devices and Materials, "Thin-Film Transistor Characteristics Fabricated on Nucleation-Controlled Poly-Si Films by Surface Steps", pp. 999–1001, 1993.

Oda et al, Extended Abstracts (The 38The Spring Meeting, 1991); The Japan Society of Applied Physics and Related Societies No. 2, "Study of Solid Phase Epitaxy Using U-LPCVD".

*Primary Examiner*—John Niebling
*Assistant Examiner*—Richard A. Booth
*Attorney, Agent, or Firm*—Nixon & Vanderhye P.C.

[57] ABSTRACT

A method for forming a polycrystalline silicon film includes the steps of: forming at least one step on a surface of an insulating substrate; depositing a first amorphous silicon film on the substrate; annealing the first amorphous silicon film so as to change the first amorphous silicon film into a first polycrystalline silicon film; patterning the first polycrystalline silicon film to form a patterned film at the at least one step of the insulating substrate, the patterned film having at least one side face; depositing a second amorphous silicon film on the insulating substrate so as to cover the patterned film; and annealing the second amorphous silicon film so as to change the second amorphous silicon film into a second polycrystalline silicon film by using the at least one side face of the pattered film as a seed crystal for lateral solid-phase crystallization.

9 Claims, 14 Drawing Sheets

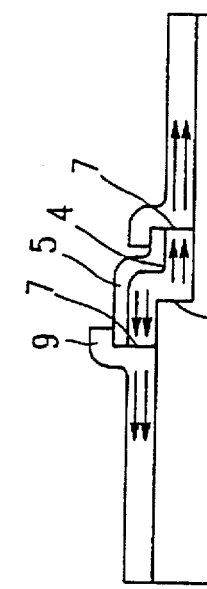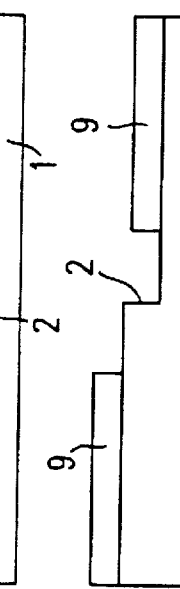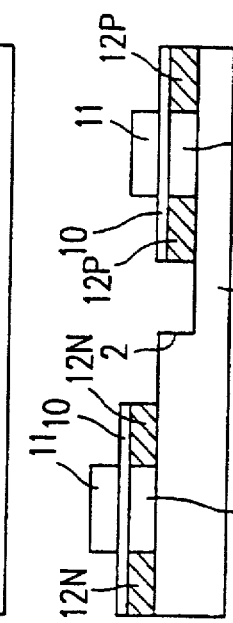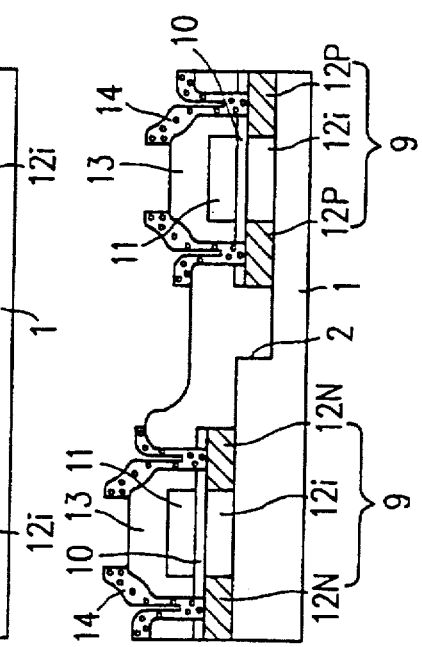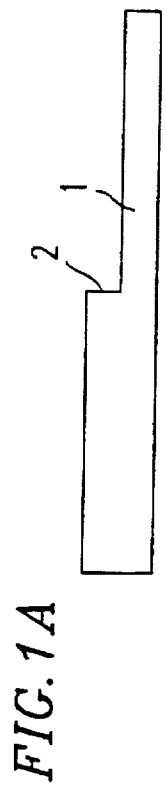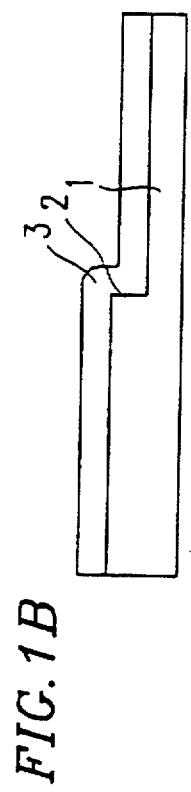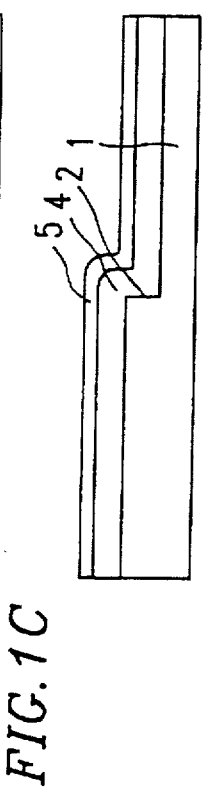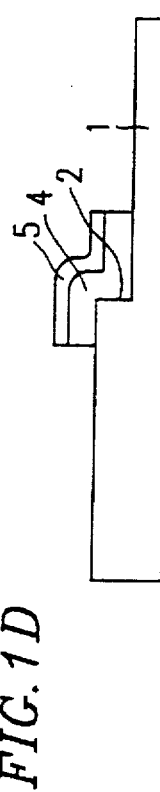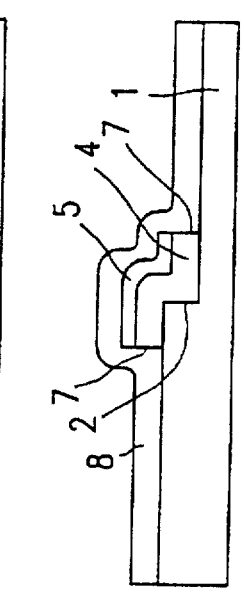

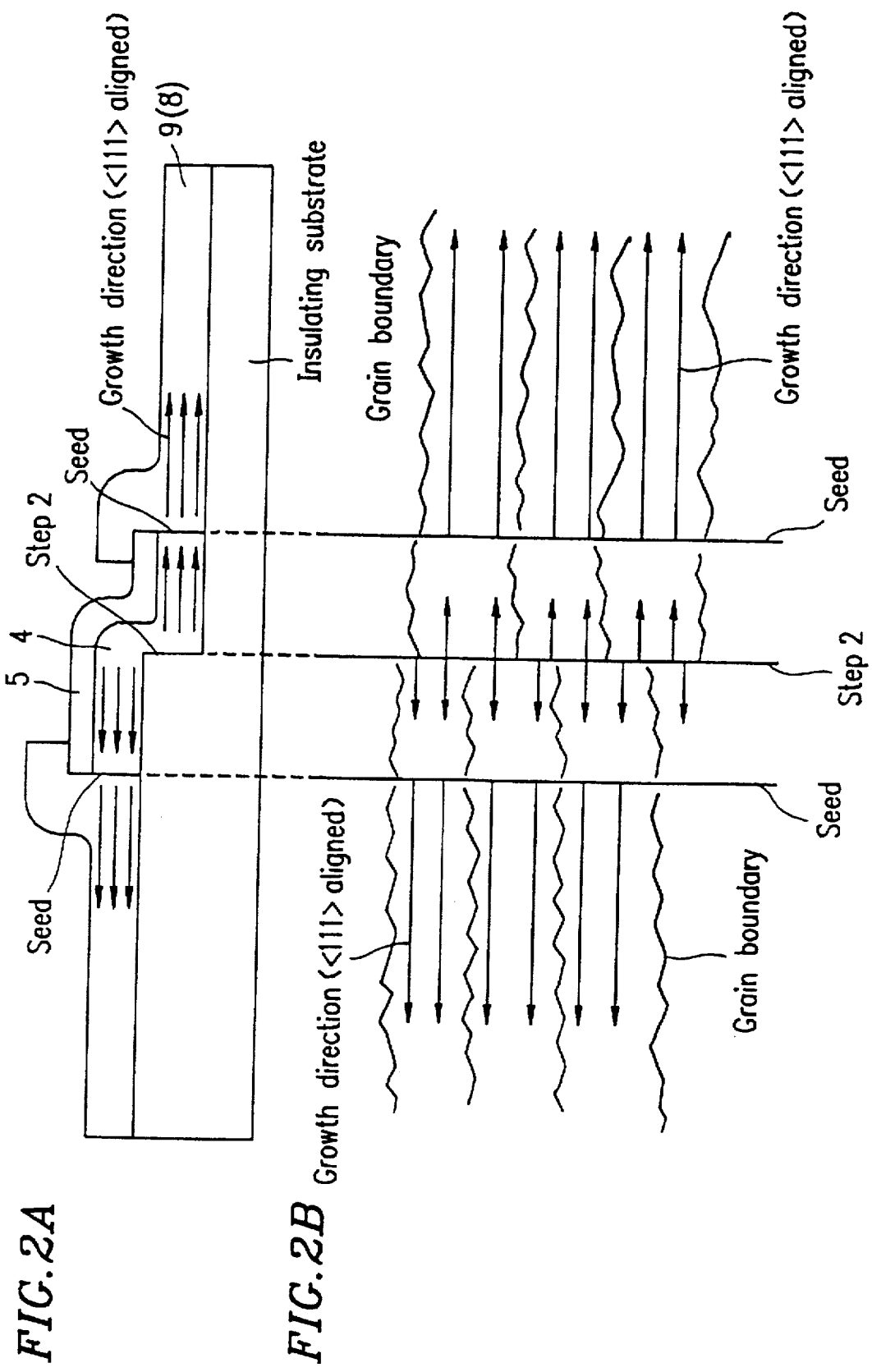

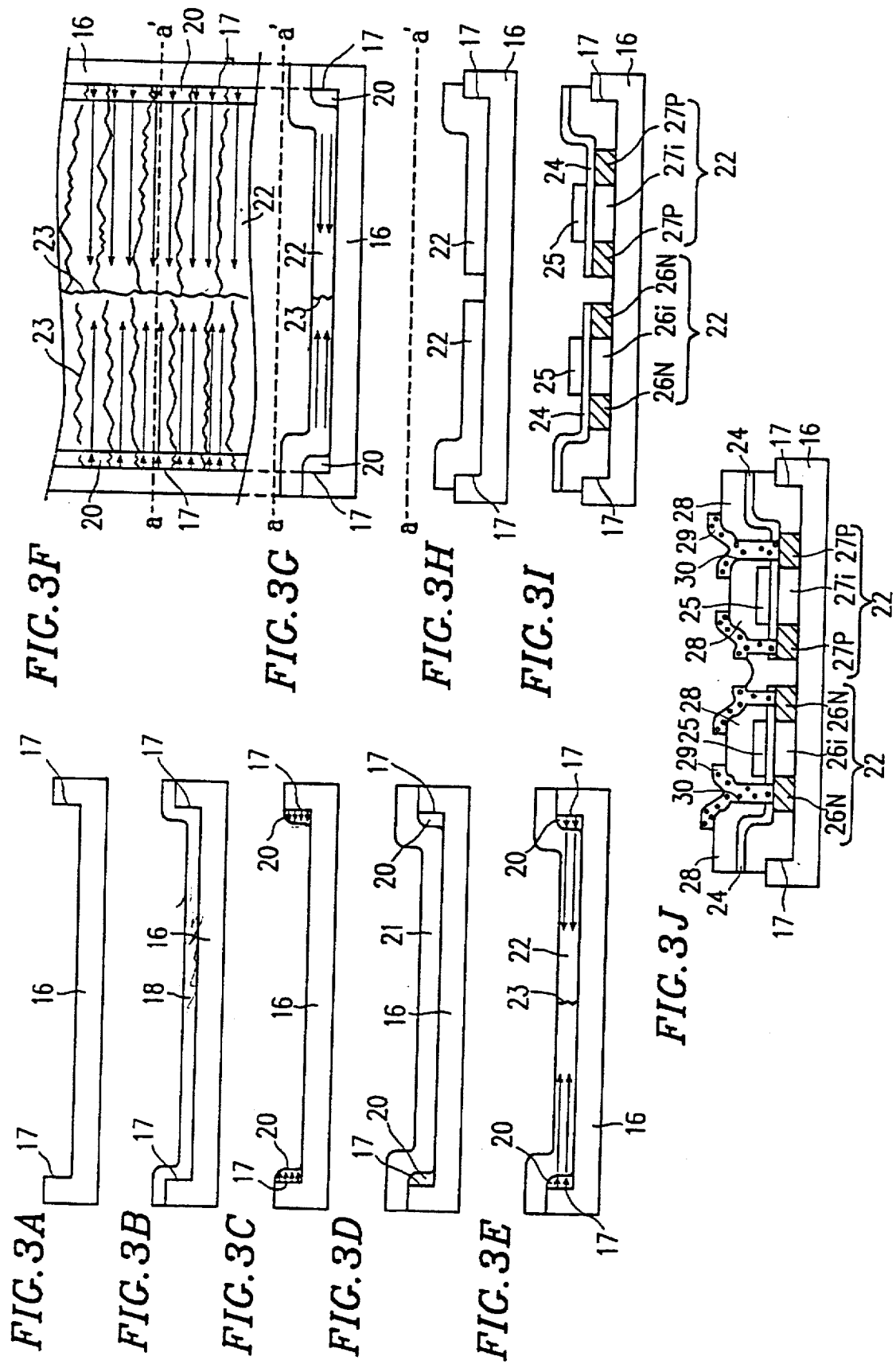

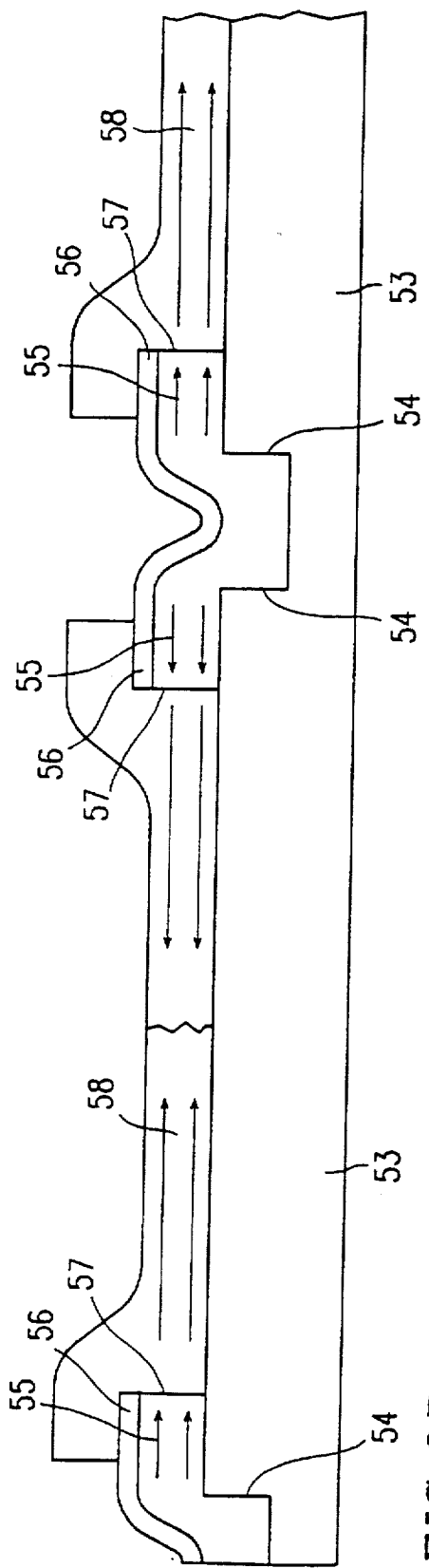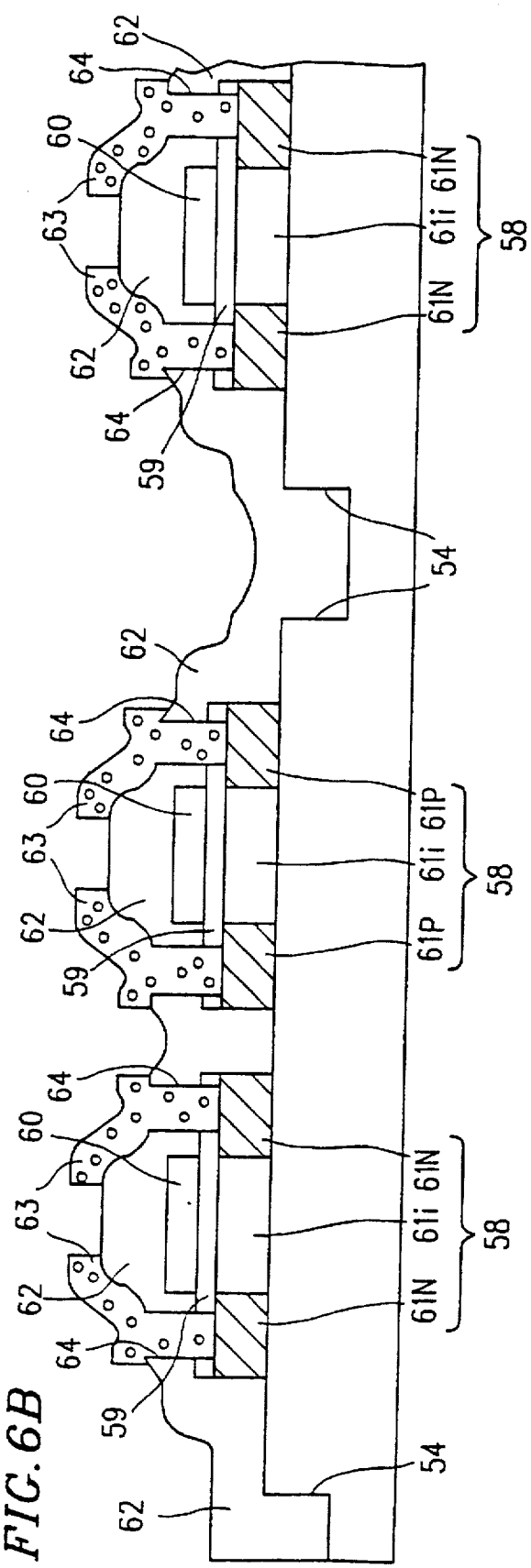
FIG. 6A
FIG. 6B

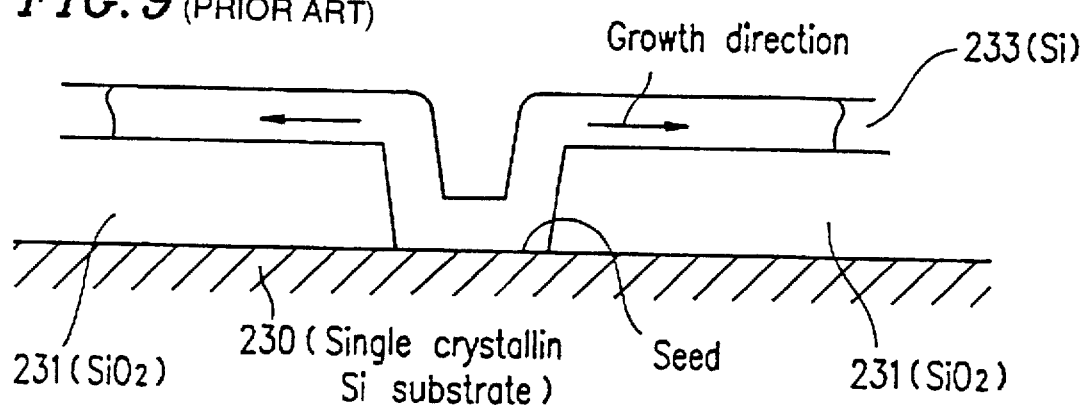

17 — Concave portion

Channel direction

Example 1

Example 2, 3, 4

METHOD FOR FORMING POLYCRYSTALLINE SILICON FILM AND METHOD FOR FABRICATING THIN-FILM TRANSISTOR

BACKGROUND OF THE INVENTION

1. Field of the Invention

The present invention relates to a method for forming a polycrystalline silicon film and a method for fabricating a thin-film transistor (TFT). More specifically, the present invention relates to a method for forming a high quality polycrystalline silicon film suitable for use in TFTs used as switching elements for pixels in an active matrix type liquid crystal display device (LCD), transistors of peripheral driving circuits in an active matrix type liquid crystal display device of a driver-monolithic system in which peripheral driving circuits are incorporated in a liquid crystal panel, and load elements in memory cell of Static Random Access Memory (SRAM), and the like; and a method for fabricating TFTs.

2. Description of the Related Art

As the pixel switching elements and driver elements in the above mentioned active matrix type liquid crystal display devices, or load elements in memory cells of SRAM and the like, TFTs having a channel region formed of polycrystalline silicon film (Poly-Si TFTs) are used. However, to obtain high performance TFTs, there are two problems in the polycrystalline silicon film as described below.

The first problem is as follows. There are many crystal defects in the grain boundaries of a polycrystalline silicon film. The grain boundaries form electrical potential barriers against the electrical carriers, i.e., electrons and holes, and serve as current barriers. This results in the reduction of carrier mobility in the polycrystalline silicon film. Therefore, a conventional Poly-Si TFT has a relatively low carrier mobility. To increase the carrier mobility, the number of grain boundaries which intersect a current path formed in the polycrystalline silicon film of the Poly-Si TFT must be decreased. That is, the positions of the grain boundaries in the polycrystalline silicon film must be controlled.

The second problem is as follows. In order to reduce the variations in the TFT characteristics, the positions of the grain boundaries must be controlled, and the crystal orientation of the grains and the direction of the current path must be aligned with each other.

To solve the two above-mentioned problems, five methods have been tried, as described below.

The first method is described in "T. ASANO, et al. Extended Abstract of the 1993 International Conference on Solid State Devices and Materials, Makuhari-1993", pages 999 to 1001. FIG. 7A is a cross-sectional view of a TFT obtained by the first method, FIG. 7B is an upper view of a polycrystalline silicon film, and FIGS. 8A to 8E are view showing a process of fabricating the TFT.

The first method proceeds as follows. First, as shown in FIG. 8A, selected areas of a surface of a Si substrate are etched to 100 nm depth by using an $SiO_2$ film (not shown) formed on the Si substrate as a mask. Then, the mask is removed, so that an Si substrate 130 having a stepped surface, i.e., steps are formed on the substrate, is prepared.

Next, as shown in FIG. 8B, the stepped surface of the Si substrate 130 is thermally oxidized to form an $SiO_2$ film 131 having a thickness of 100 nm.

Subsequently, as shown in FIG. 8C, an amorphous silicon film 132 having a thickness of 100 nm is deposited on the $SiO_2$ film 131 by an electron beam evaporation method.

After that, as shown in FIG. 8D, solid-phase crystallization of the amorphous silicon film 132 is carried out at a temperature of 600° C. in an $N_2$ atmosphere, so as to form a polycrystalline silicon film 133. In the amorphous silicon film 132, lateral crystal growth starts from each step which serve as a nuclei for solid-phase crystallization. Accordingly, crystal grains are formed so as to have a uniform crystal orientation which is aligned in a direction perpendicular to the side faces of the steps. The length of each crystal grain is approximately 3 μm. As shown in FIG. 8D, during lateral crystal growth from a step, an adjacent nucleus 137 is generated between the steps. The nucleus 137 conflicts with the lateral crystallization from the step, and stops the lateral growth of crystal grain. As a result, as shown in FIG. 7B, a grain boundary is formed at this position.

Next, as shown in FIG. 8E, a source region 135a and a drain region 135b are formed by thermal diffusion from a solid diffusion source, and a gate insulating film 134 having a thickness of 100 nm is formed by thermal oxidization at a temperature of 1050° C. Then, a gate electrode 136G, a source electrode 136S, and a drain electrode 136D are formed thereon using Al. As a result, a TFT having a gate width of 50 μm, a gate length of 10 μm, and a gate thickness of 100 nm is fabricated.

In the second method, Si solid-phase growth is conducted by using a U-LPDVD method, which is described in "N. Ono, et al Extended Abstracts (The 38th Spring Meeting, 1993); The Japan Society of Applied Physics and Related Societies, page 742, 31p-X-12 'An Si solid-phase growth using an U-LPCVD method'". FIG. 9 shows a cross-sectional view of a polycrystalline silicon film obtained by the second method. FIGS. 10A to 10D show a process of forming a polycrystalline silicon film according to the second method.

The second method proceeds as follows: first, as shown in FIG. 10A, an insulating film 231, having a thickness of 100 nm is deposited on a (100) Si substrate 230. Then, the insulating film 231 is patterned so as to expose a selected portion of a surface of the substrate 230, as shown in FIG. 10B.

Next, as shown in FIG. 10C, an amorphous silicon film 232 is deposited on the insulating film 231, so as to cover the exposed portion of the substrate 230, by an LPCVD method. In this case, the temperature is set in a range of 490° C. to 500° C., and $Si_2H_6$ gas is used as a material gas for the LPCVD.

After that, as shown in FIG. 10D, by using the exposed portion of the surface of the (100) Si substrate 230 as a seed for crystallization, the amorphous silicon film 232 is crystallized to a polycrystalline silicon film 233 by solid-phase crystallization for 20 hours. In this case, as shown in FIG. 9, the polycrystalline silicon film 233 grown in a direction parallel to the surface of the insulating film 231 (lateral direction) has the same orientation as that of the Si substrate which is used as the seed. In the case where the amorphous silicon film is formed by using an $Si_2H_6$ gas as a material gas, the growth length of a lateral solid-phase epitaxy (L-SPE) is approximately three times as long as that obtained in the case where an $SiH_4$ gas is used as the material gas (approximately 14 μm).

The third method is disclosed in Japanese Laid-Open Patent Publication No. 2-143414. FIGS. 11A to 11E are views showing processes of forming a polycrystalline silicon film according to the third method.

The third method proceeds as follows. First, as shown in FIG. 11A, a groove is formed on an insulating substrate 329 made of a glass, and the like.

Next, as shown in FIG. 11B, an amorphous silicon film 332, having a thickness of 0.1 μm, is deposited on the insulating substrate 329. Then, Si ions are implanted thereto (the acceleration voltage: 140 keV, the implant dose: $6 \times 10^{16}$ cm$^{-2}$), so that the amorphous silicon film 332 becomes completely amorphous.

Subsequently, as shown in FIG. 11C, the amorphous silicon film 332 is crystallized for 15 hours at a temperature of 750° C., so as to become a polycrystalline silicon film 333. In this case, at the corner of the groove, crystals having a uniform orientation grow.

After that, as shown in FIG. 11D, Si ions are implanted in a direction perpendicular to the substrate (the acceleration voltage 80 keV, the implant dose:$6 \times 10^{16}$ cm$^{-2}$), so that the polycrystalline silicon film 333 becomes amorphous 332a. In this case, the corners 333a of the groove remain as polycrystalline silicon which serve as seeds for solid-phase crystallization.

Next, as shown in FIG. 11E, solid-phase crystallization of the silicon film 332a in an amorphous state is carried out for 20 hours at a temperature of 650° C., so as to become a polycrystalline silicon film 333b. In this case, a polycrystalline silicon film having crystal grains with a uniform orientation can be obtained by using the polycrystalline silicon portion 333a of the groove as a seed for crystallization.

The fourth method is disclosed in Japanese Laid-Open Patent Publication No. 4-367217. The fourth method proceeds as follows. First, a quartz substrate is etched so as to form a step having a height of 2000 Å.

Next, a polycrystalline silicon film is deposited by an LPCVD method on the substrate. In this case, SiH$_4$ gas is used as a material gas. The flow rate is set to 50 sccm, the pressure to 0.3 torr, and the growth temperature to 620° C.

After that, As ions are implanted in the polycrystalline silicon film (the acceleration voltage 150 keV, the implant dose:$5 \times 15$ ions/cm$^{-2}$), so that the polycrystalline silicon film becomes amorphous. In this case, since the thickness of the polycrystalline silicon film at the side of the step is larger than that of the other portions of the polycrystalline silicon film, the portion at the side of the step remains polycrystalline. By using the polycrystalline portion as a seed for crystallization, the amorphous silicon film is crystallized.

The fifth method is disclosed in Japanese Laid-Open Patent Publication No. 4-367218. The fifth method proceeds as follows. First, an SiO$_2$ film is deposited on an Si substrate so as to have a thickness of 4000 Å. Then, a resist pattern is formed thereon. By etching the SiO$_2$ film, a step having a depth of 4000 Å is formed in the SiO$_2$ film.

Next, a polycrystalline silicon film is formed by an LPCVD method on the SiO$_2$ film. In this case, SiH$_4$ gas is used as a material gas. The flow amount is set to 50 sccm, the pressure to 0.3 torr, and the temperature to 620° C.

After that, an As ion is implanted in the polycrystalline silicon film (the accelerating voltage 150 keV, the implant dose:$5 \times 15$ ions/cm$^{-2}$), so that the polycrystalline silicon film becomes amorphous. In this case, since the edge of the step portion has a thickness larger than that of the other portions, the edge of the step portion remains polycrystalline.

Next, the silicon film which has become amorphous is solid-phase crystallized for 1 hour at a temperature of 650° C., so as to become a polycrystalline silicon film. In this case, crystals grow in a lateral direction by using the polycrystalline silicon which remains at the edge portion of the step as a seed. Accordingly, crystals having a uniform orientation grow to a large grain diameter. As a result, a polycrystalline silicon film having crystals with a large grain diameter and grain boundaries in a uniform direction can be obtained.

As described above, to realize a high-performance TFT, a polycrystalline silicon film having substantially no grain boundaries in a current path of the TFT must be obtained by controlling the positions of grain boundaries and aligning an orientation of crystal grains. However, problems occur in the above-discussed first to fifth methods.

In the first method, the amorphous silicon film is crystallized having an orientation perpendicular to the side of the step, and the grain diameter is approximately 3 μm from the step. Accordingly, when a TFT having a gate length longer than 3 μm is fabricated, a plurality of grain boundaries are included in the channel region, and therefore, a plurality of grain boundaries exist in the current path. Therefore, high mobility cannot be realized. Moreover, when a TFT having a gate length of 3 μm or less is fabricated, a short channel effect is generated, i.e., the decrease and the large variations in threshold voltage (Vth) and the decrease in the pressure-resistance between a source and a drain become pronounced. As a result, TFT characteristics suitable for practical use cannot be obtained.

In the second method, a large grain diameter of approximately 14 μm can be obtained in a lateral direction. However, since an Si substrate is used as a seed, it is impossible in principle to form a polycrystalline silicon film on an insulating substrate by controlling grain boundaries.

In the third method, as shown in FIG. 12A, the polycrystalline portion serving as a seed is subjected to Si ion implantation at a non-uniform distance. Accordingly, as shown in FIG. 12B, a region in which amorphous silicon and polycrystalline silicon are mixed is formed (the portion below from the point B), and a boundary C between the amorphous silicon portion (from the point A to the point B) and the polycrystalline silicon portion (the portion above from A') is not clearly determined. Accordingly, when an amorphous silicon film is crystallized by using the remaining polycrystalline silicon portion as a seed, a polycrystalline silicon film having a uniform orientation cannot be obtained. Moreover, depending on the energy level of ion implantation, there are some cases where a seed disappears or an unnecessary portion remains. Accordingly, it is difficult to produce appropriate seeds for crystallization with good reproducibility.

In the fourth and fifth methods, since a deposited polycrystalline silicon film is used as a seed, the grain diameter of the seed is small (approximately 0.05 μm). When an amorphous silicon film is recrystallized, crystal grains grow to have the same orientation as that of the polycrystalline seed. Accordingly, control of the orientation of the polycrystalline seed is required. In addition, since ion implantation is performed by using As at a high concentration, it is impossible to form a non-doped polycrystalline silicon film. Accordingly, the polycrystalline silicon films obtained in these methods are not suitable for use in TFTs.

SUMMARY OF THE INVENTION

The method for forming polycrystalline silicon film of this invention includes the steps of: forming at least one step on a surface of an insulating substrate; depositing a first amorphous silicon film on the substrate; annealing the first amorphous silicon film so as to change the first amorphous silicon film into a first polycrystalline silicon film; patterning the first polycrystalline silicon film to form a patterned film at the at least one step of the insulating substrate, the patterned film having at least one side face; depositing a second amorphous silicon film on the insulating substrate so as to cover the patterned film; and annealing the second amorphous silicon film so as to change the second amorphous silicon film into a second polycrystalline silicon film by using the at least one side face of the pattered film as a seed crystal for lateral solid-phase crystallization.

In one embodiment of the invention, a method for forming a polycrystalline silicon film further includes the step of forming an insulating film over the first polycrystalline silicon film prior to patterning the first polycrystalline silicon film.

In another embodiment of the invention, forming the at least one step on the surface of the insulating substrate includes etching the insulating substrate to form at least one ridge portion on the surface of the insulating substrate.

In still another embodiment of the invention, forming the at least one step on the surface of the insulating substrate includes etching the insulating substrate to form at least one groove portion on the surface of the insulating substrate.

In still another embodiment of the invention, forming the at least one step on the surface of the insulating substrate includes etching the insulating substrate to form at least one concave portion on the surface of the insulating substrate.

In still another embodiment of the invention, patterning the first polycrystalline silicon film includes etching away a selected portion of the first polycrystalline silicon film so as to form the patterned film across the at least one step of the insulating substrate.

In still another embodiment of the invention, the at least one side face of the patterned film is parallel with at least one side face of the at least one step of the insulating substrate.

In still another embodiment of the invention, patterning the first polycrystalline silicon film includes etching back the first polycrystalline silicon film by an anisotropic etching so as to form the patterned film at the at least one side of the at least one step of the insulating substrate.

According to another aspect of the invention, a method for fabricating a thin-film transistor includes the steps of: forming at least one step on a surface of an insulating substrate; depositing a first amorphous silicon film on the substrate; annealing the first amorphous silicon film so as to change the first amorphous silicon film into a first polycrystalline silicon film; patterning the first polycrystalline silicon film to form a patterned film at the at least one step of the insulating substrate, the patterned film having at least one side face; depositing a second amorphous silicon film on the insulating substrate so as to cover the patterned film; annealing the second amorphous silicon film so as to change the second amorphous silicon film into a second polycrystalline silicon film by using the at least one side face of the pattered film as a seed crystal for lateral solid-phase crystallization; and forming a transistor including a channel region in the second polycrystalline silicon film, the channel region of the transistor being formed in such a manner that a current path of the channel region is perpendicular to at least one side face of the at least one step of the insulating substrate.

A first amorphous silicon film is formed on an insulating substrate in which a step is formed, and then, the first amorphous silicon film is subjected to a thermal processing so as to be solid-phase crystallized. As a result, a first polycrystalline silicon film having a uniform orientation in a direction perpendicular to a side of a step, starting from the step, can be obtained. The first polycrystalline silicon film has grains (approximately 3 μm) larger than those obtained in the case where a polycrystalline silicon film is deposited on a substrate (approximately 0.05 μm).

The first polycrystalline silicon film is patterned while retaining the region having crystals in uniform orientation (i.e., regions at the step and the periphery thereof, or at the side wall). On the thus-obtained polycrystalline silicon film, a second amorphous silicon film is formed and is subjected to thermal processing. Then, the second amorphous silicon film epitaxially grows in a lateral direction using the side of the first polycrystalline silicon film as a seed. As a result, a polycrystalline silicon film having large grains can be obtained with controlled orientation and controlled positions of boundaries.

If a channel region is formed in the second polycrystalline silicon film in such a manner that a current path is formed in a direction perpendicular to the side of the step, the current path coincides with the direction of epitaxy growth (a lateral direction). As a result, a channel region having substantially no grain boundaries in a direction of the current path and having crystal grains in a uniform orientation can be obtained.

If an insulating film is formed on the first polycrystalline silicon film prior to patterning, and the first polycrystalline silicon film and the insulating film are simultaneously patterned, the surface of the first polycrystalline silicon film is covered with the insulating film. Accordingly, influence of only the orientation in a lateral direction is obtained and there is no influence of the orientation in a perpendicular direction.

Thus, the invention described herein makes possible the advantages of providing a method for forming a polycrystalline silicon film in which the positions of grain boundaries are controlled and the orientation of each crystal grain is uniform, thereby forming a polycrystalline silicon film on an insulating substrate; allowing for the fabrication of TFTs with excellent repeatability having substantially no grain boundaries in a current path in a channel region; and a method for fabricating a TFT.

These and other advantages of the present invention will become apparent to those skilled in the art upon reading and understanding the following detailed description with reference to the accompanying figures.

BRIEF DESCRIPTION OF THE DRAWINGS

FIGS. 1A to 1I are cross-sectional views showing a process of fabricating a TFT according to Example 1 of the present invention.

FIG. 2A is a cross-sectional view showing a polycrystalline silicon film according to Example 1 of the present invention. FIG. 2B is a top view of a polycrystalline silicon film according to Example 1 of the present invention.

FIGS. 3A to 3E and 3G are cross-sectional views showing a process for fabricating a TFT according to Example 2 of the present invention. FIGS. 3H to 3J are views showing a process for fabricating a TFT according to Example 2 of the present invention. FIG. 3F is a top view of a structure of TFT shown in FIG. 3G according to Example 2 of the present invention.

FIG. 6A is a cross-sectional view showing a process for forming a polycrystalline silicon film according to Example 4 of the present invention. FIG. 6B is a cross-sectional view showing a TFT according to Example 4 of the present invention.

FIG. 9 is a cross-sectional view showing a conventional polycrystalline silicon film.

DESCRIPTION OF THE PREFERRED EMBODIMENTS

Figure 4A:
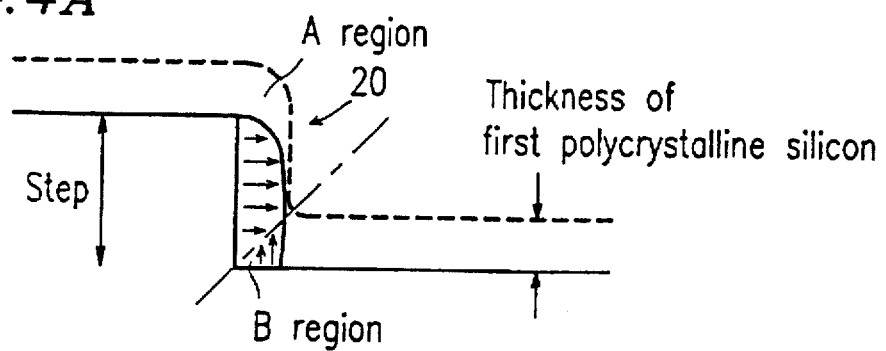
FIG. 4A is a view showing a case where a first polycrystalline silicon film used for forming a side wall is thin.

Hereinafter, the present invention will be described by way of illustrative examples with reference to the accompanied drawings.

EXAMPLE 1

FIG. 1I is a cross-sectional view of TFTs according to this example. The TFTs are formed on a upper portion and a lower portion of an insulating substrate 1. There is a step 2 between the upper portion and the lower portion of the insulating substrate 1. Each TFT includes a polycrystalline silicon film 9 formed on the insulating substrate. The polycrystalline silicon film 9 for an n-type TFT includes a channel region 12$i$, n-type source/drain regions 12N doped with phosphorus. The polycrystalline silicon film 9 for a p-type TFT includes a channel region 12$i$, p-type source/drain regions 12P doped with boron.

Each TFT has a gate insulating film 10 formed on the polycrystalline silicon film 9, and a gate electrode 11 formed on the gate insulating film 10. Each gate electrode 11 is formed so as to be opposed to the channel region 12$i$. An interlevel insulating film 13 covers the polycrystalline silicon film 9, the gate insulating film 10 and the gate electrode 11. On the interlevel insulating film 13, source/drain electrodes 14 are formed so as to be electrically connected to the n-type source region 12N and the p-type source region 12P and the n-type drain region 12N and the p-type drain region 12P respectively via contact hole portions formed at the gate insulating film 10 and the interlevel insulating film 13.

As shown in FIGS. 2A and 2B, the polycrystalline silicon film 9 includes crystal grains having a uniform crystal orientation aligned in a direction perpendicular to the side faces of the step 2. Each crystal grain of the polycrystalline silicon film 9 extends from the seed crystals in a lateral direction. This is because the lateral solid-phase epitaxy in an amorphous silicon film starts from the seed crystals and proceeds in a direction perpendicular to the side faces of the step 2. As a result, the crystal orientations of the grains of the polycrystalline silicon film 9 are aligned in a <111> direction.

The channel region 12$i$ of each TFT is formed in such a manner that the current path in the channel region 12$i$ is formed in a direction perpendicular to the side faces of the step 2. Accordingly, no grain boundaries substantially exist in the direction of the current path.

Hereinafter, the process of fabricating the TFT according to this example will be described.

First, as shown in FIG. 1A, a selected area of the top surface of the insulating substrate 1 made of glass, quartz, or the like is etched so as to form the step 2. It is preferable that the step 2 has a height substantially the same as the thickness of an amorphous silicon film 3 and the thickness of a second amorphous silicon film 8 to be deposited later. If the height of the step 2 and the thicknesses of the first amorphous silicon film 3 and the second amorphous silicon film 8 are substantially the same as each other, the most uniform crystal orientation can be obtained at the step 2 in the lateral direction. This is because the first amorphous silicon film 3 is crystallized starting from the side of the step 2, and the second amorphous silicon film 8 is crystallized by using the patterned side of the first polycrystalline silicon film 4 as a seed for crystal growth. The height of the step 2 is preferably in a range of about 50 to about 500 nm. This is because if a polycrystalline silicon film having a thickness larger than about 500 nm is used as the channel region 12$i$ of the TFT, a leakage current increases; Also, if a polycrystalline silicon film having a thickness smaller than about 50 nm is used as the channel region 12$i$ of the TFT, crystal grains do not grow to a sufficiently large diameter when the amorphous silicon film is crystallized. In this example, the depth of the step 2 is set to 100 nm.

Next, as shown in FIG. 1B, the amorphous silicon film 3 having a thickness substantially the same as the depth of the step 2 is deposited by an LPCVD method on the substrate 1. In the case where an $Si_2H_6$ gas is used as a material gas in depositing the amorphous silicon film 3, solid-phase crystallized grains grow to a large diameter as compared with the case where an $SiH_4$ gas is used as the material gas. According to the fabrication method of the present invention, it can be expected that crystal grains will grow to a diameter of about 3 μm or more. The deposition temperature is preferably about 400° to about 550° C. If the deposition temperature is too low, the reaction does not occur, and if the temperature is too high, a polycrystalline film grows and an amorphous silicon film is not obtained. In this example, the amorphous silicon film having a thickness of 100 nm is deposited at a temperature of 500° C. under a pressure of 25 Pa by using an $Si_2H_6$ gas as the material gas.

The first amorphous silicon film 3 is annealed by a solid-phase crystallization method in an $N_2$ atmosphere, so as to form a first polycrystalline silicon film 4. The annealing in an $N_2$ atmosphere is preferably conducted at a temperature in a range of about 600° to about 700° C. If the temperature for crystallization is too low, crystallization does not occur, and if the temperature for crystallization is too high, the crystallization rate becomes high and crystal grains having a large diameter cannot be obtained. About 6 hours or more are sufficient for crystallization, however, about 18 to about 24 hours are desirable for excellent crystallization. In this example, annealing is performed for 24 hours at a temperature of 600° C. Examples of annealing methods for polycrystallization include a laser annealing method using an excimer laser, an Ar ion laser, and the like and short-time annealing performed by the application of heat by a halogen lamp. By annealing, the first polycrystalline silicon film 4 grows starting from the step 2 so as to have an orientation uniform in a direction perpendicular to the side of the step 2.

Subsequently, as shown in FIG. 1C, an insulating film 5 is deposited on the first polycrystalline silicon film 4. Then, as shown in FIG. 1D, the first polycrystalline silicon film 4 and the insulating film 5 are selectively etched while retaining the step portion and the periphery thereof. Since the first polycrystalline silicon film 4 grows laterally to a length of approximately 3 µm from the step in a state that the orientation is uniform, it is desired that the step portion and the periphery thereof used as a seed are retained at a length of about 2 to about 4 µm at one side of the step, that is, in a range of about 4 to about 8 µm at both sides of the step in total. In this example, the patterning is performed while retaining the step portion and the periphery thereof at a length of 2 µm at one side, that is, at a length of 4 µm at both sides in total. Although the formation of the insulating film 5 can be omitted, it is desirable to form the insulating film 5. This is because if the insulating film is formed, the second amorphous silicon film 8 can be crystallized while getting influence of orientation only in a lateral direction from the side of the first polycrystalline silicon film 4 without getting influence of orientation in a perpendicular direction from the upper side of the first polycrystalline silicon film 4. In this example, the insulating film 5 having a thickness of 40 nm or more made of $SiO_2$ is formed by a CVD method.

After that, as shown in FIG. 1E, a second amorphous silicon film 8 is deposited. It is desirable that the second amorphous silicon film 8 is deposited under the same conditions as that of the first amorphous silicon film 3. In this example, the amorphous silicon film 8 having a thickness of 100 nm is deposited under the same conditions as that of the first amorphous silicon film 3.

Then, as shown in FIG. 1F, the region of the second amorphous silicon film 8 including the step 2 is etched. Subsequently, the second amorphous silicon film 8 is annealed in an $N_2$ atmosphere, by using the exposed side of the first polycrystalline silicon film 4 as a seed, by a solid-phase crystallization method so as to be a second polycrystalline silicon film 9. The reason for selective etching of the second amorphous silicon film 8 as described above is as follows. In the case where the second amorphous silicon film 8 is not etched, the second amorphous silicon film 8 on the insulating film 5 is not influenced by the seed. Accordingly, there is a possibility that a second polycrystalline silicon film 9 having non-uniform orientation will grow. Moreover, the second amorphous silicon film 8 adversely affects the other portions during the process of its growth to the second polycrystalline silicon film 9. On the other hand, in the case where the second amorphous silicon film 8 is etched, the first polycrystalline silicon film 4 does not exert influence on the polycrystallization of the second amorphous silicon film 8 on the insulating film 5, so that epitaxy growth from only the side of the step 2 is achieved. As a result, excellent orientation in a lateral direction can be obtained. It is desirable that the second amorphous silicon film 8 is annealed under the same conditions as that of the first amorphous silicon film 3. In this example, the second amorphous silicon film 8 was annealed at a temperature of 600° C. for 24 hours. Examples of annealing methods for polycrystallization include a laser annealing method using an excimer laser, an Ar ion laser, or the like and short-time annealing performed by the application of heat by a halogen lamp. By annealing, the second amorphous silicon film 8 epitaxially grows in a lateral direction while having an orientation the same as that of the side (the seed) of the exposed first polycrystalline silicon film 4. That is, as shown in FIGS. 2A and 2B, a second polycrystalline silicon film 9 having large grains (~10 µm or more) in which grain boundaries do not exist in a direction of a current path (i.e., a direction perpendicular to the side of the step 2) can be obtained.

Next, as shown in FIG. 1G, the second polycrystalline silicon film 9 is patterned in an island-shape. On the thus-obtained second polycrystalline silicon film 9, as shown in FIG. 1H, a gate insulating film 10 having a thickness of 50 nm made of $SiO_2$ is formed by a CVD method. The gate insulating film 10 can be formed by oxidizing the polycrystalline silicon film. On the gate insulating film 10, a gate electrode 11 is formed. After that, an impurity (phosphorous is used for an N-channel TFT, and boron is used for a P-channel TFT) is implanted into the second polycrystalline silicon film 9 by an ion implantation method using the gate electrode 11 as a mask. Accordingly, the n-type source region 12N and the p-type source region 12P and the n-type drain region 12N and the p-type drain regions 12P are formed in self alignment with the gate electrode 11. A channel region 12i is formed under the gate electrode 11 and into which impurities are not implanted.

Next, an interlevel insulating film 13 made of $SiO_2$ and having a thickness of 500 nm is deposited by a CVD method. Then, thermal treatment is performed on the interlevel insulating film 13 at a temperature of 950° C. for approximately 30 minutes.

Finally, contact holes are formed in the interlevel insulating film 13. Then, source/drain electrodes 14 are formed by using Al and the like, so that the p-type source/drain regions 12P are electrically connected thereto through the contact holes. As a result, the TFT shown in FIG. 1I is obtained.

EXAMPLE 2

FIG. 3J is a cross-sectional view showing TFTs according to this example. The TFTs are formed on a concave portion of an insulating substrate 16 having steps 17. Each TFT includes a polycrystalline silicon film 22. The polycrystalline silicon film 22 for an n-type TFT includes a channel region 26i, and source/drain regions 26N doped with phosphorus. A polycrystalline silicon film 22 for a p-type TFT includes a channel region 27i, and source/drain regions 27P doped with boron. On the second polycrystalline silicon film 22, a gate insulating film 24 is formed. On the gate insulating film 24, a gate electrode 25 is formed so as to be opposed to the channel regions 26i and 27i, and an interlevel insulating film 28 is formed so as to cover the gate electrode 25. On the interlevel insulating film 28, a source electrode 29 and a drain electrode 29 are formed. The source electrode 29 and the drain electrode 29 are electrically connected to the n-type source region 26N and the p-type source region 27P and the n-type drain region 26N and the p-type drain region 27P respectively via contact hole portions 30 formed at the gate insulating film 24 and the interlevel insulating film 28.

As shown in FIGS. 3F and 3G, in the polycrystalline silicon film 22, crystals grow to have a uniform orientation in a direction perpendicular to the side of the step 17. The channel regions 26i and 27i are formed such that the current path is formed in a direction perpendicular to the side of the step 17. Accordingly, no grain boundaries substantially exist in the direction of the current path.

Hereinafter, the process of fabricating the TFT according to this example will be described.

First, as shown in FIG. 3A, a selected area of an insulting substrate 16 made of quartz, etc. is etched so as to form a concave portion, having a size of 30 μm×100 μm, with steps 17. It is desired that the steps 17 have a height substantially the same as the thickness of an amorphous silicon film 18 and the thickness of a second amorphous silicon 21. Specifically, the depth thereof is preferably in a range of about 50 nm to about 500 nm.

Next, as shown in FIG. 3B, a first amorphous silicon film 18 having a thickness of 50 nm is deposited at a temperature of 500° C. under pressure of 25 Pa by an LPCVD method using an $Si_2H_6$ gas as a material gas. The first amorphous silicon film 18 is annealed in an $N_2$ atmosphere by a solid-phase crystallization method at a temperature of 600° C. for 24 hours, so that a first polycrystalline silicon film is formed. It is desirable that the first amorphous silicon film 18 is deposited and annealed under conditions substantially the same as that described in Example 1. Examples of annealing methods for polycrystallization include a laser annealing method using an excimer laser, an Ar ion laser, or the like and a short-time annealing performed by the application of heat by a halogen lamp.

Figure 4B:
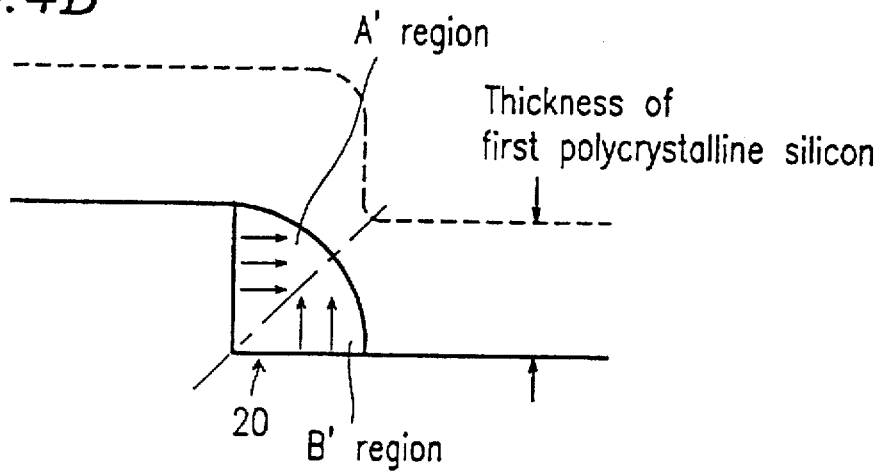
FIG. 4B is a view showing a case where a first polycrystalline silicon film used for forming a side wall is thick.

Subsequently, as shown in FIG. 3C, the first polycrystalline silicon film is etched back so as to form side walls 20 at the steps 17. The etch-back process is performed by an anisotropic dry-etching method. The side walls 20 are <111> oriented in a direction perpendicular to the side faces of the steps 17, i.e., in a direction parallel to an insulating substrate 16. The thickness of the side walls 20 measured from the side faces of the steps 17 is preferably about half or less of the height of the step. The reason thereof is as follows. Each side wall 20 formed by the etch-back process has a thickness substantially equal to that of the first polycrystalline silicon film 18. Moreover, as shown in FIG. 4A, the side wall 20 includes an A region and a B region having crystal orientations different from each other. The crystal orientation of the A region is in a lateral direction, and that of the B region is in a vertical direction. In this case, if the first polycrystalline silicon film has a thickness half or less of the height of the step as shown in FIG. 4A, the size of the A region having an orientation in a lateral direction can be made larger than that of the B region. On the other hand, if the first polycrystalline silicon film has a thickness more than the half of the height of the step as shown in FIG. 4B, the size of an A' region having crystal orientation in a lateral direction becomes smaller than that of a B' region, so that lateral epitaxy growth is suppressed. Accordingly, it is considered to be appropriate that a seed crystal (side wall 20) used for lateral epitaxy growth has a thickness about half or less than the height of the step. In the formation of the side wall 20, it is not desirable to directly deposit a polycrystalline silicon film, because if a polycrystalline silicon film is directly deposited, the surface roughness of the film becomes large.

After that, as shown in FIG. 3D, a second amorphous silicon film 21 having a thickness of 100 nm is deposited at a temperature of 500° C. under pressure of 25 Pa by an LPCVD method using an $Si_2H_6$ gas as a material gas. Then, as shown in FIG. 3E, the second amorphous silicon film 21 is annealed in an $N_2$ atmosphere at a temperature of 600° C. for 24 hours by a solid-phase crystallization method using the side wall 20 as a seed crystal, so as to form a second polycrystalline silicon film 22. It is desirable that the amorphous silicon film 21 is deposited and annealed under conditions substantially the same as that employed for the first amorphous silicon film 18. Examples of annealing methods for crystallization include a laser annealing method using an excimer laser, an Ar ion laser, or the like and a short-time annealing performed by the application of heat by a halogen lamp. By annealing of the second amorphous silicon film 21, crystal grains grow having an orientation the same as that of the side wall 20, i.e., they grow in a direction parallel to the insulating substrate 16 while aligning in the <111> direction. More specifically, as shown in FIGS. 3F and 3G, the lateral crystal growth starts from each of the steps 17 of the concave portion, and conflict with each other in the middle of the concave portion. As a result, a grain boundary 23 is formed as shown in FIG. 3F. It is desirable that the patterning for forming a channel region of a TFT is performed in such a manner that the grain boundary 23 is not included in the channel region. FIG. 3G shows a cross-section of a TFT shown in FIG. 3F cut at an a-a' line.

Subsequently, a second polycrystalline silicon film 22 is patterned in an island-shape as shown in FIG. 3H. After that, with processes the same as described in Example 1, a TFT as shown in FIG. 3I is formed.

Figure 13A:
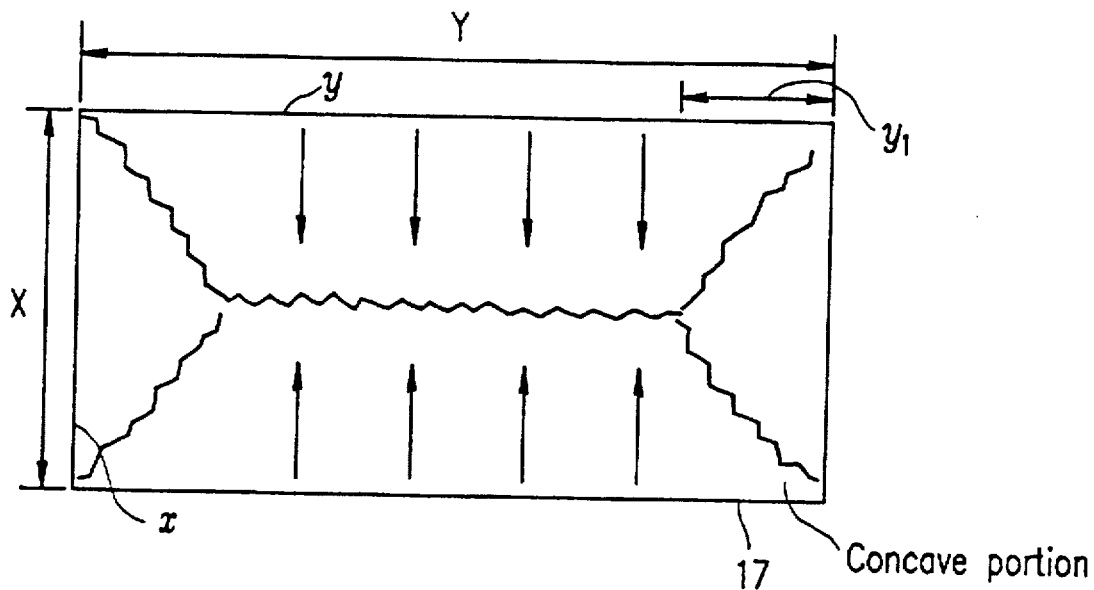
FIG. 13A is a plan view showing that the second polycrystalline silicon film is grown in the concave portion.
Figure 13B:
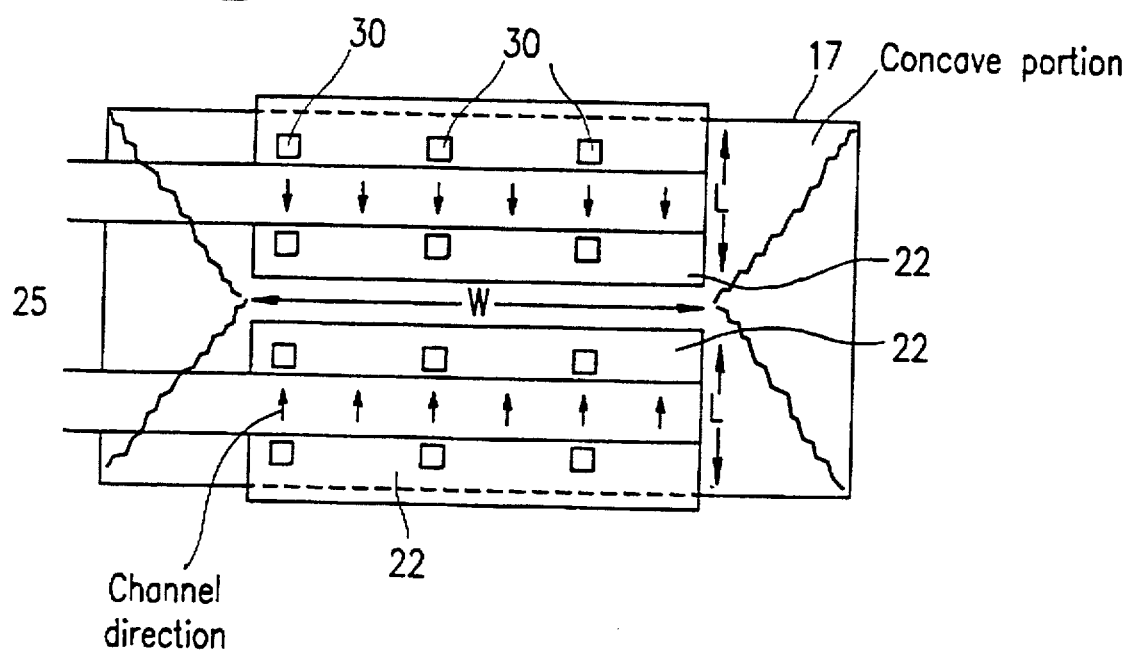
FIG. 13B is a plan view showing a TFT fabricated by using the thus-obtained second polycrystalline silicon film.

The size of the concave portion shown in FIG. 3A (30 μm×100 μm) is only an example, and the size thereof is determined based on the size of the TFT intended to be fabricated. FIG. 13A and 13B show a relationship between a gate length L and a gate width W of a TFT, and a length X of one side x and a length Y of the other side y of a concave portion. FIG. 13A is a plan view showing that the second polycrystalline silicon film is grown in the concave portion, and FIG. 13B is a plan view showing the TFT fabricated by using the thus-obtained second polycrystalline silicon film. As shown in FIG. 13B, in order that grain boundaries do not exist or hardly exist in a current path of the TFT, as shown in FIG. 13A, the concave portion is required to have dimensions of at least X>2L and Y>W, and more preferably, X>2L and Y>W+$y_1$. In this way, it is possible to prevent grain boundaries from existing in the current path of the TFT. The above-mentioned $y_1$ prescribes a length in a direction along with a side y of the grain boundary formed from the corners of the concave portion in a direction diagonal to the sides. In this example, as described above, the size of the concave portion is set to approximately 30 μm×100 μm, so that L is set to approximately 10 μm and W is set to approximately 50 μm.

EXAMPLE 3

Figure 5A:
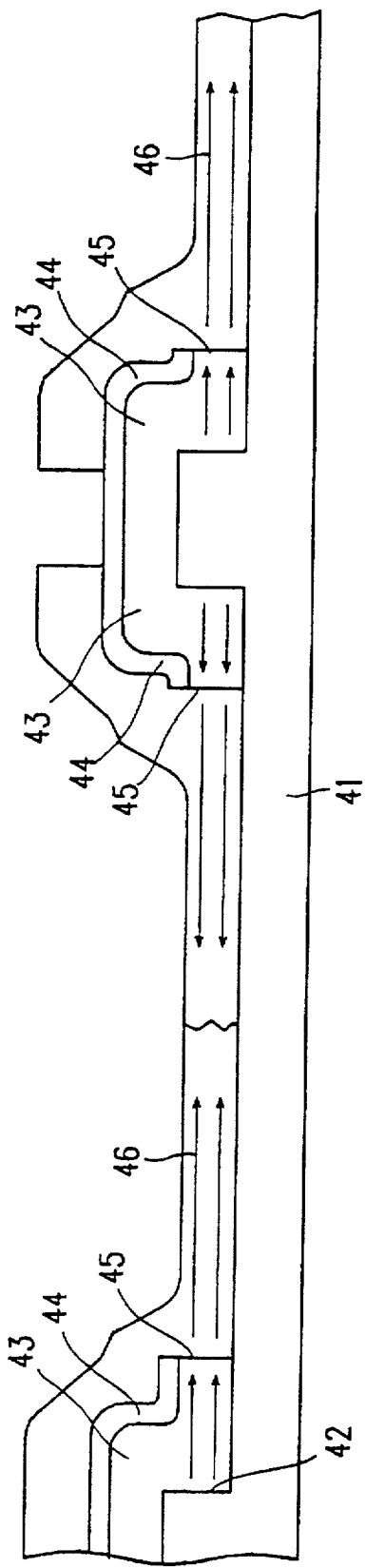
FIG. 5A is a cross-sectional view showing a process of forming a polycrystalline silicon film according to Example 3 of the present invention.
Figure 5B:
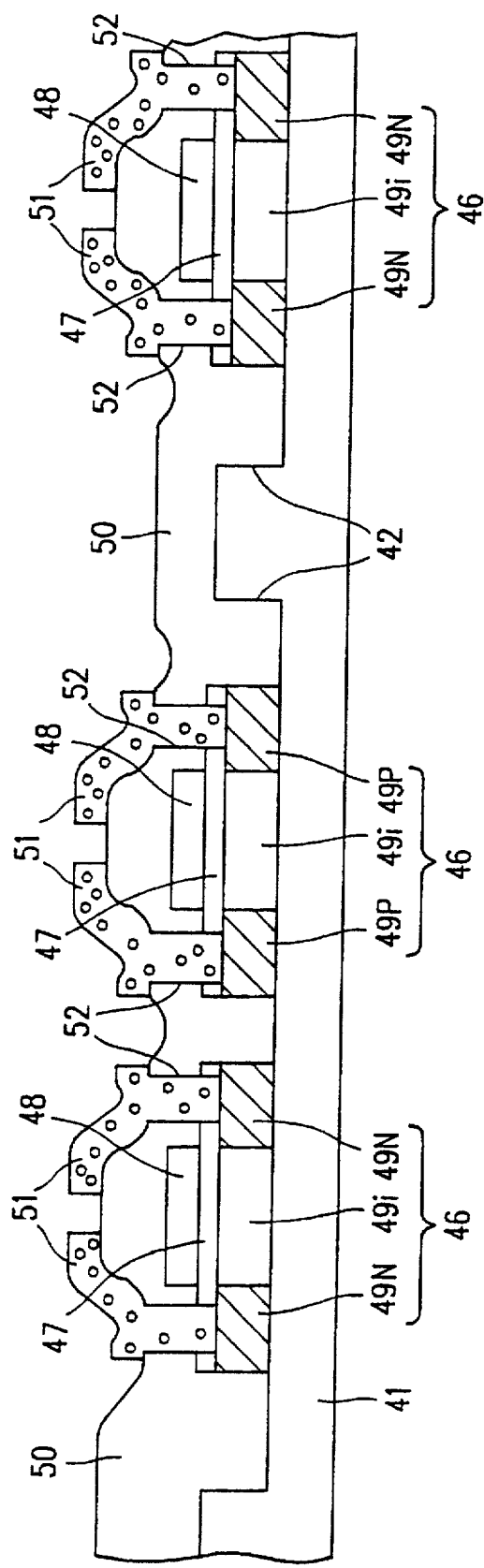
FIG. 5B is a cross-sectional view showing a TFT according to Example 3 of the present invention.
Figures 7A, 7B:
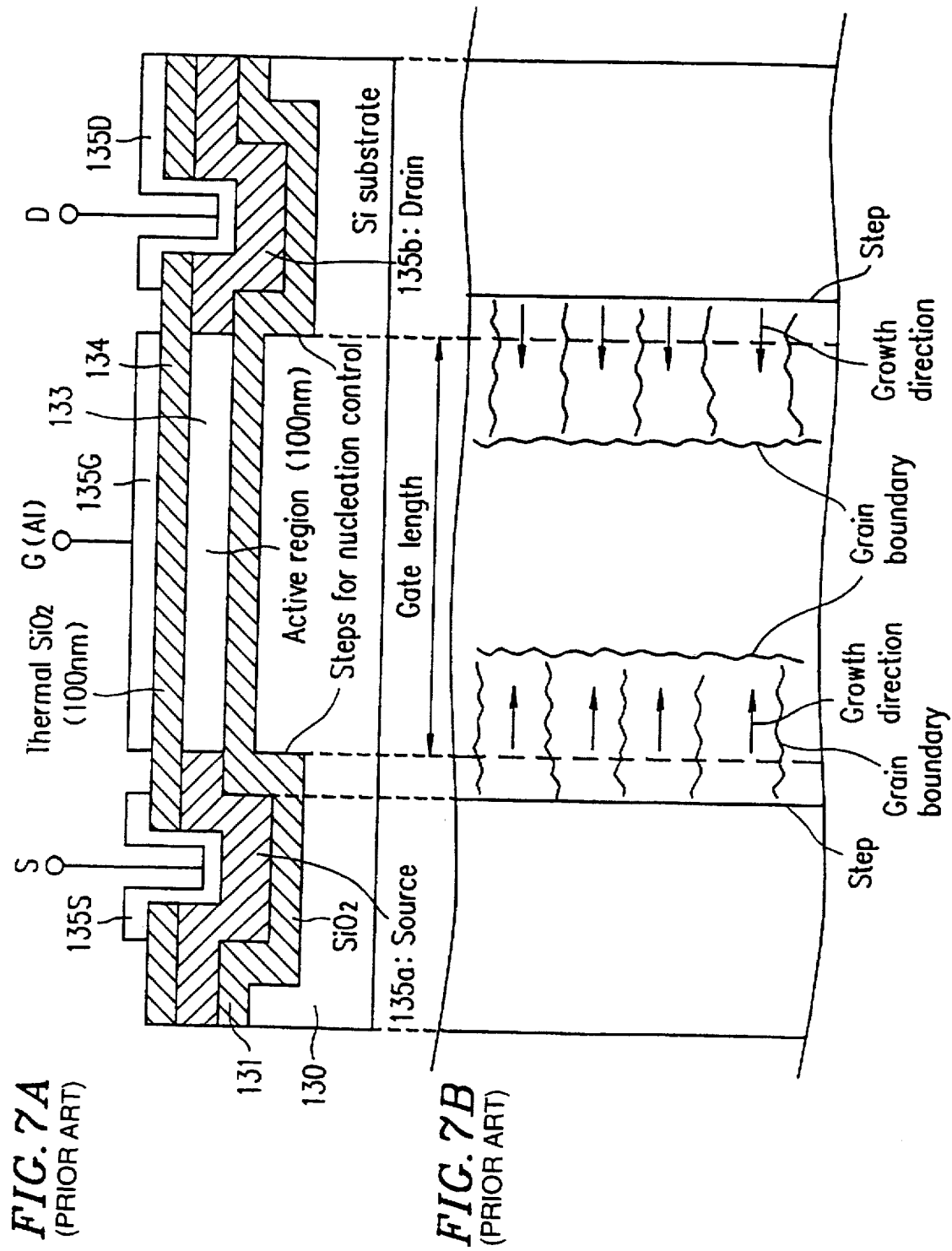
FIG. 7A is a cross-sectional view showing a conventional TFT.
FIG. 7B is a top view showing a polycrystalline silicon film of the conventional TFT.
Figure 8A:
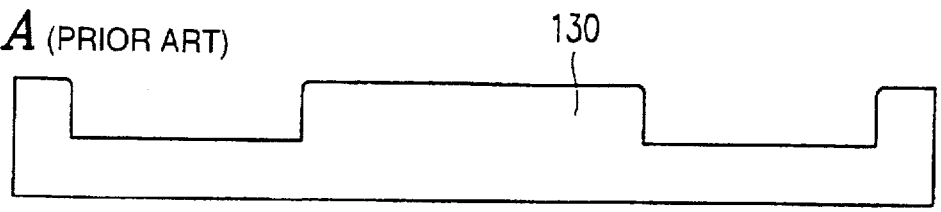
FIGS. 8A to 8E are cross-sectional views showing a process of forming a conventional TFT.
Figure 8B:
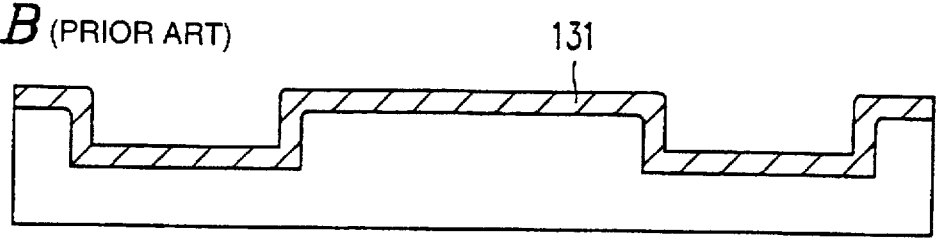
Figure 8C:
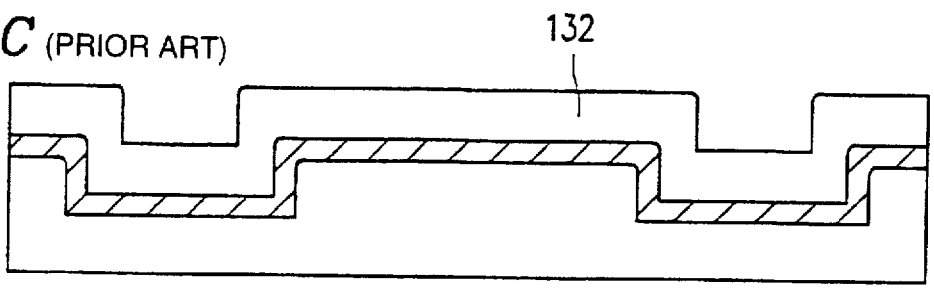
Figure 8D:
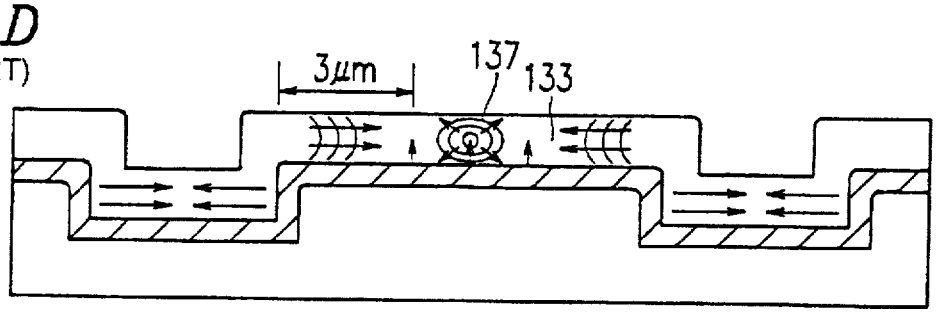
Figure 8E:
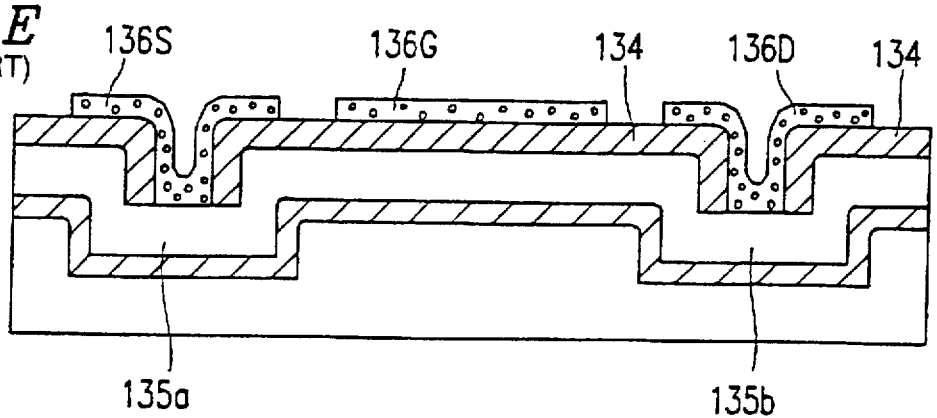
Figure 10A:
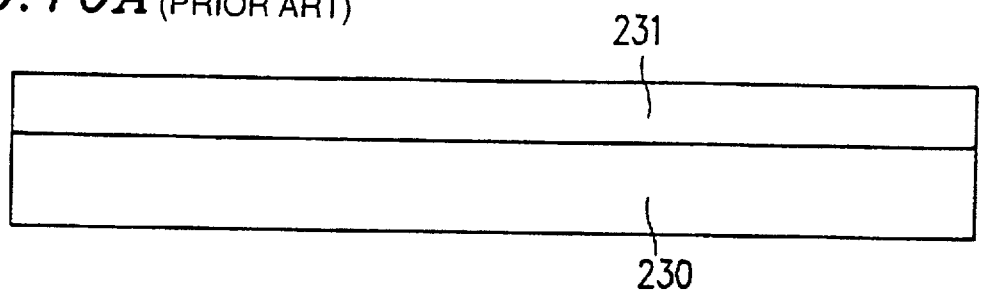
FIGS. 10A to 10D are cross-sectional views showing a process of forming a conventional polycrystalline silicon film.
Figure 10B:
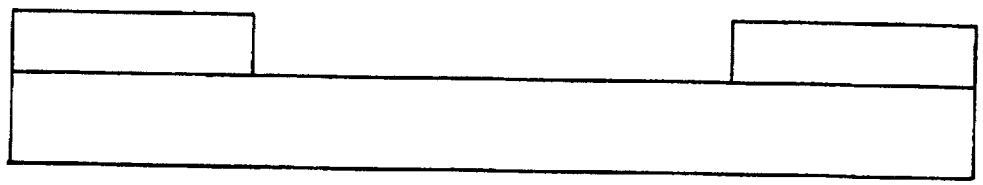
Figure 10C:
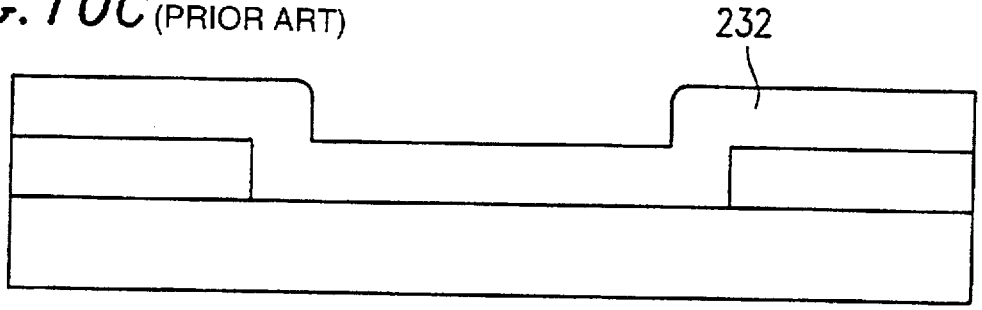
Figure 10D:
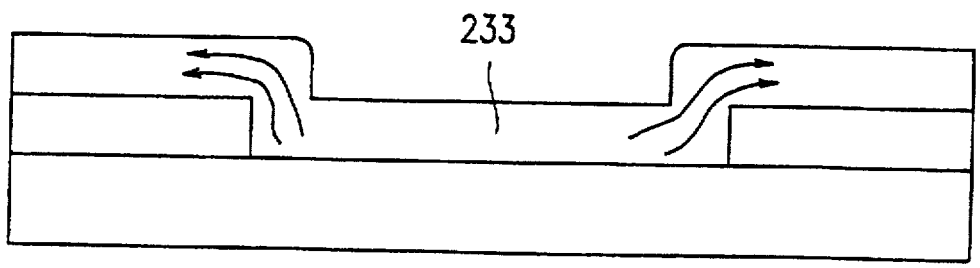
Figure 11A:
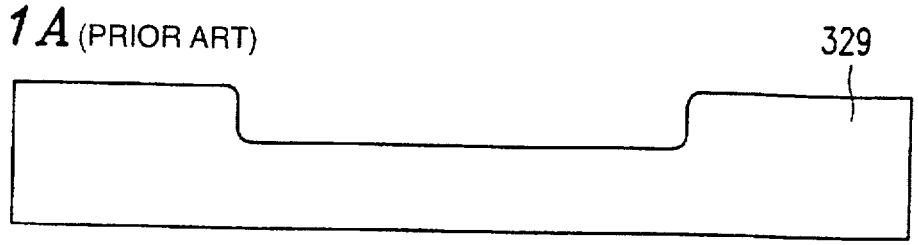
FIGS. 11A to 11E are cross-sectional views showing a process of forming a conventional polycrystalline silicon film.
Figure 11B:
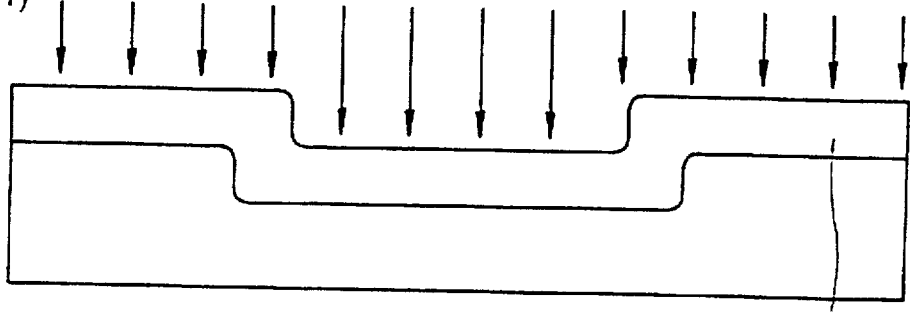
Figure 11C:
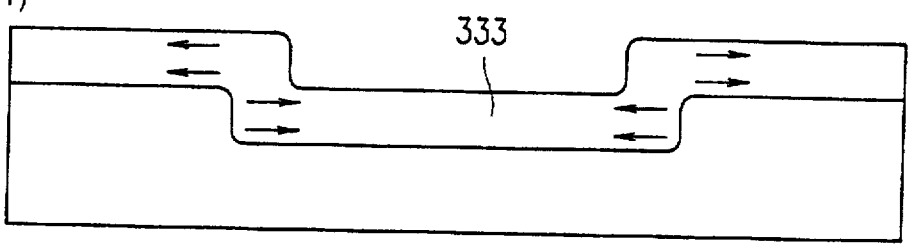
Figure 11D:
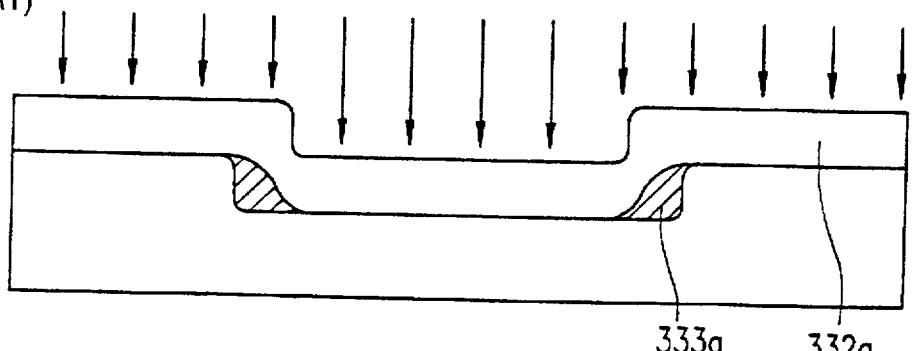
Figure 11E:
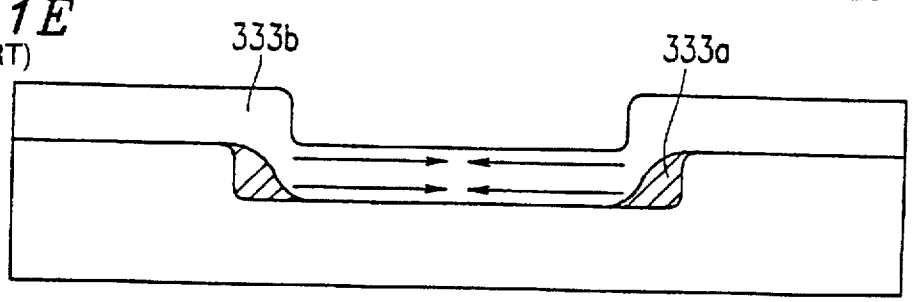
Figure 12A:
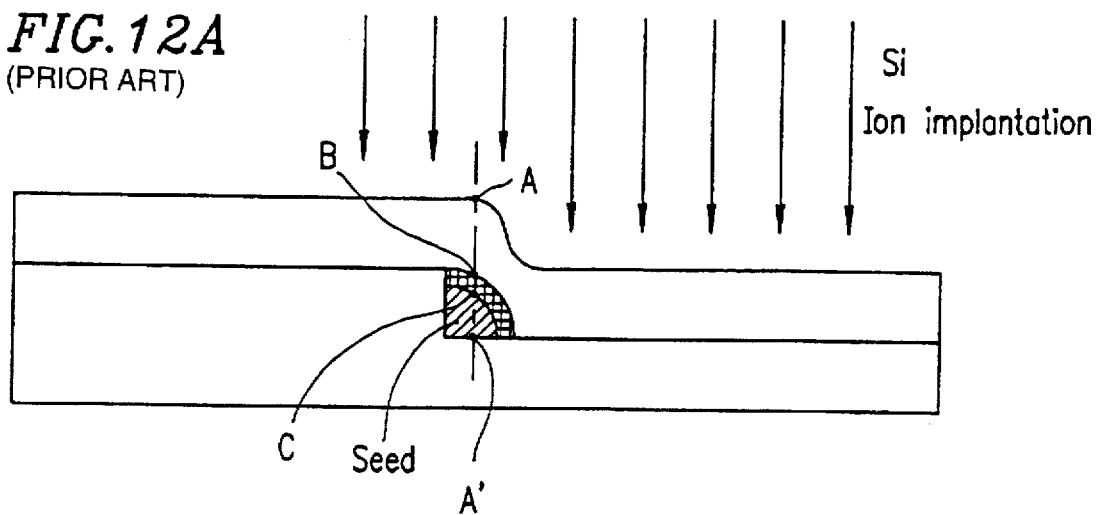
FIG. 12A is a cross-sectional view showing a process of ion implantation according to a method for forming a conventional polycrystalline silicon film.
Figure 12B:
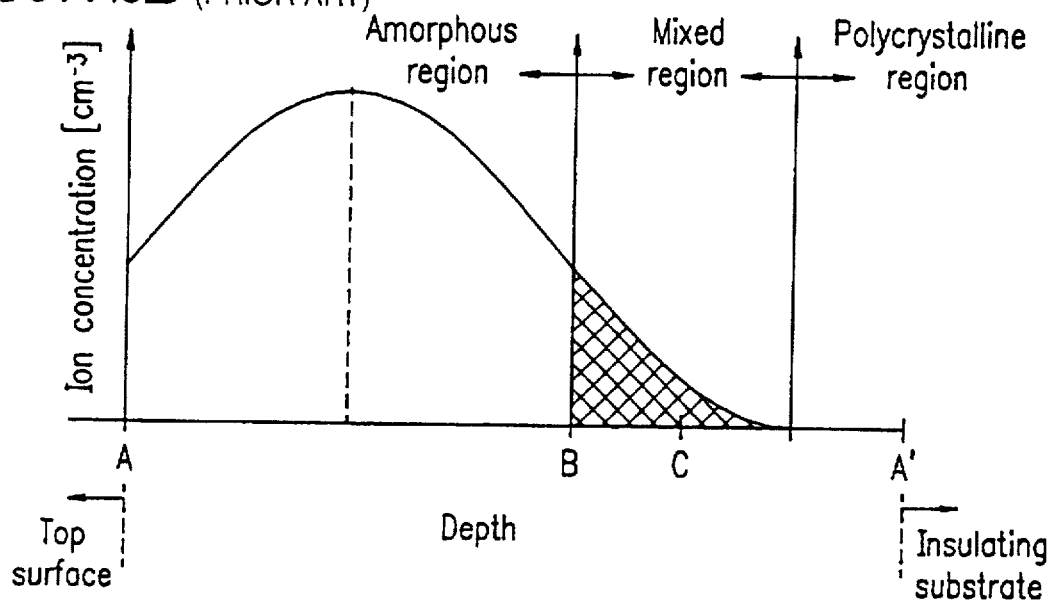
FIG. 12B is a distribution chart showing an amount of ion implantation in a depth direction.

FIG. 5B is a cross-sectional view showing TFTs according to this example. The TFTs are formed on concave portions of an insulating substrate 41. There is at least one ridge portion between the concave portions of the insulating substrate 41. Each ridge portion forms steps 42 on the surface of the insulating substrate 41. Each TFT includes a polycrystalline silicon film 46 formed on the insulating substrate 41. The polycrystalline silicon film 46 for an n-type TFT includes—a channel region 49i, n-type source/drain regions 49N doped with phosphorus. The polycrystalline silicon film 46 for a p-type TFT includes a channel region 49i, p-type source/drain regions 49P doped with boron.

Each TFT has a gate insulating film 47 formed on the polycrystalline silicon film 46, and a gate electrode 48 formed on the gate insulating film 47. Each gate electrode 48 is formed so as to be opposed to the channel region 49i. An interlevel insulating film 50 covers the polycrystalline silicon film 46, the gate insulating film 47 and the gate electrode 48. On the interlevel insulating film 50, source/drain electrodes 51 are formed so as to be electrically connected to the n-type source region 49N and the p-type source region 49P and the n-type drain region 49N and the p-type drain region 49P respectively via contact holes formed in the gate insulating film 47 and the interlevel insulating film 50.

As shown in FIGS. 5A, the polycrystalline silicon film 46 contains crystal grains having a uniform crystal orientation in a direction perpendicular to the side faces of the steps 42. As shown in FIG. 5B, the channel region 49i of each TFT is formed in such a manner that the current path in the channel region 49i is formed in a direction perpendicular to the side faces of the steps 42. Accordingly, no grain boundaries substantially exist across the current path of each TFT.

With reference to FIGS. 5A and 5B, the process of fabricating the TFT according to this example will be described.

By annealing a deposited first amorphous silicon film, crystal grains laterally grow from side faces of the steps 42 in a direction perpendicular to the side faces of the steps 42 so as to form a first polycrystalline silicon film 43. The first polycrystalline silicon film 43 is patterned to form a patterned first polycrystalline silicon film over the steps 42, as shown in FIG. 5A. On the side faces 45 of the patterned first polycrystalline silicon film, the surface of the aligned crystal grains in the patterned first polycrystalline silicon film are exposed. Then, a second amorphous silicon film is deposited on the insulating substrate 41 to cover the patterned first polycrystalline silicon film 43. The second amorphous silicon film is annealed so as to form a second polycrystalline silicon film 46 by using the side faces 45 of the patterned first polycrystalline silicon film 43 as a seed crystal for solid-phase crystallization. In this case, it is desirable that an insulating film 44 is formed on the top of the first polycrystalline silicon film 43 in order that only the side faces 45 of the patterned first polycrystalline silicon film 43 serve as the seed crystal.

EXAMPLE 4

FIG. 6B is a cross-sectional view showing TFTs according to this example. The TFTs are formed on a convex portion of an insulating substrate 53. At least one groove is formed on the surface of the insulating substrate 53 so as to form steps 54. Each TFT includes a polycrystalline silicon film 58 formed on the insulating substrate 53. The polycrystalline silicon film 58 for an n-type TFT includes a channel region 61i, n-type source/drain regions 61N doped with phosphorus. The polycrystalline silicon film 58 for a p-type TFT includes a channel region 61i, p-type source/drain regions 61P doped with boron.

Each TFT has a gate insulating film 59 formed on the polycrystalline silicon film 58, and a gate electrode 60 formed on the gate insulating film 59. Each gate electrode 60 is formed so as to be opposed to the channel region 61i. An interlevel insulating film 62 covers the polycrystalline silicon film 58, the gate insulating film 59 and the gate electrode 60. On the interlevel insulating film 62, source/drain electrodes 63 are formed so as to be electrically connected to the n-type source region 61N and the p-type source region 61P and the n-type drain region 61N and the p-type drain region 61P respectively via contact hole portions formed in the gate insulating film 59 and the interlevel insulating film 62.

As shown in FIGS. 6A, the polycrystalline silicon film 58 contains crystal grains having a uniform crystal orientation in a direction perpendicular to the side faces of the steps 54. As shown in FIG. 6B, each channel region 61i is formed in such a manner that the current path is formed in a direction perpendicular to the side faces of the steps 54. Accordingly, no grain boundaries substantially exist across the current path.

With reference to FIG. 6A, the process of fabricating the TFT according to this example will be described.

By annealing a first amorphous silicon film, crystal grains grow at the steps 54 and the periphery thereof in a direction perpendicular to the side of the steps 54. The first polycrystalline silicon film is patterned to form a patterned first polycrystalline silicon film 55 over the steps 54, as shown in FIG. 6A. Then, a second amorphous silicon film is formed to cover the patterned first polycrystalline silicon film 55. The second amorphous silicon film is annealed so as to form the second polycrystalline silicon film 58 by using side faces 57 of the patterned first polycrystalline silicon film 55 as a seed for crystallization. In this case, it is desirable that an insulating film 56 is formed on the first polycrystalline silicon film 55 in order that only the side faces of the patterned first polycrystalline silicon film 55 serve as the seed.

As is understood from Examples 1, 3, and 4, when the step portion and the periphery thereof of the first polycrystalline silicon film are retained so as to be used as a seed, TFTs can be formed on the bottom of the concave portion and also can be formed on the upper side of the convex portion.

Table 1 shows the effects obtained in each of the examples, including controllability of seed, flexibility of the layout (design), and productivity.

TABLE 1

<Controllability of seed>

1) Example 1: Since an insulating film is deposited and therefore only the side faces of a seed are exposed, the length of the seed are controlled. (1)
2) Example 2: Since a seed is formed by anisotropic dry-etching, the controllability of the seed is inferior as compared with Example 1. (2)
3) Example 3: Same as Example 2 (2)
4) Example 4: Same as Example 1 (1)

<Flexibility of layout (design)>

1) Example 1: Since two TFTs can be fabricated from one step (one TFT can be fabricated on a upper portion of the step, and one TFT can be fabricated on a lower portion thereof), the fabrication of TFTs is easier. (1)
2) Example 2: Since only one TFT can be formed from one step (only one TFT is fabricated on a lower portion of the step), the fabrication of TFTs is more difficult. As to the flatness of the interlevel insulating film, etc., the same comments as in Example 3. (3) hold.
3) Example 3: Whereas flexibility of design is inferior as compared with Example 1, a TFT is formed only on a lower portion of the step, so that a flat interlevel insulating film, etc. can be obtained more easily as compared with Example 1. (2)
4) Example 4: Same as Example 3. (3)

<Productivity>

1) Example 1: Since an insulating film is deposited on a seed, productivity is decreased. (2)
2) Example 2: Since there is no need to deposit an insulating film in a process of forming a seed, the number of process steps is decreased. (1)

TABLE 1-continued

3) Example 3: Same as Example 2. (1)
4) Example 4: Same as Example 1. (2)

Remarks: Numbers in () denotes ranking of excellence.

A. Controllability of seed

Figure 14A:
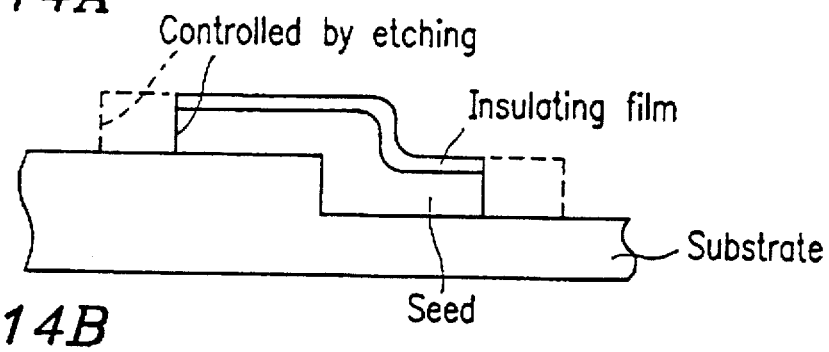
FIGS. 14A to 14D are cross-sectional views for illustrating the difference in effects obtained from each of the examples.

As to Examples 1 and 4, as shown in FIG. 14A, the side faces of the seed crystal are exposed. Accordingly, even if the length of the lateral growth from the step is short, as far as photolithography or etching performed under this length, it can be used as a seed crystal. Accordingly, the most stable seed crystal can be obtained. On the other hand, in a method for forming a seed described in Examples 2 and 3, since anisotropic dry-etching is performed, it is difficult to control the thickness of the seed.

B. Flexibility of layout (design)

Figure 14B:
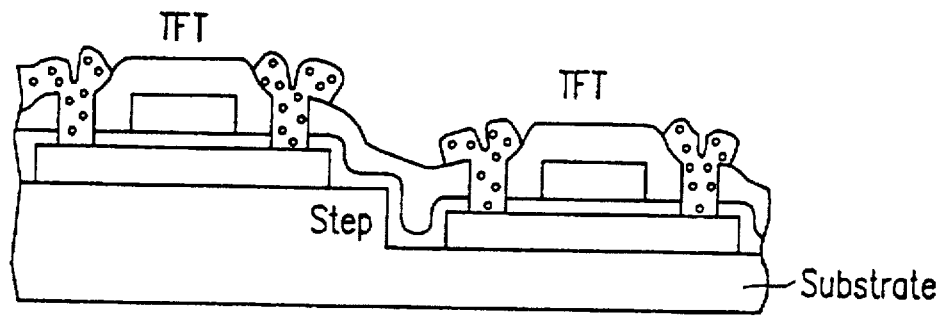
Figure 14C:
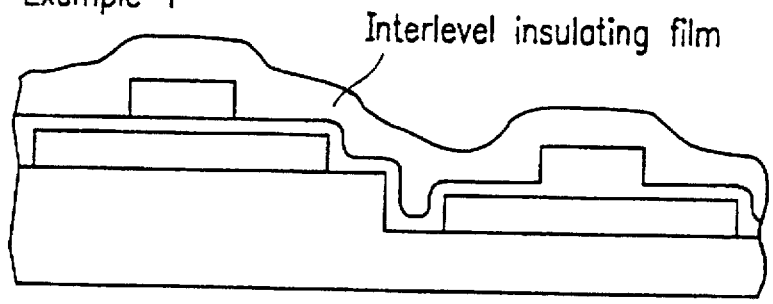
Figure 14D:
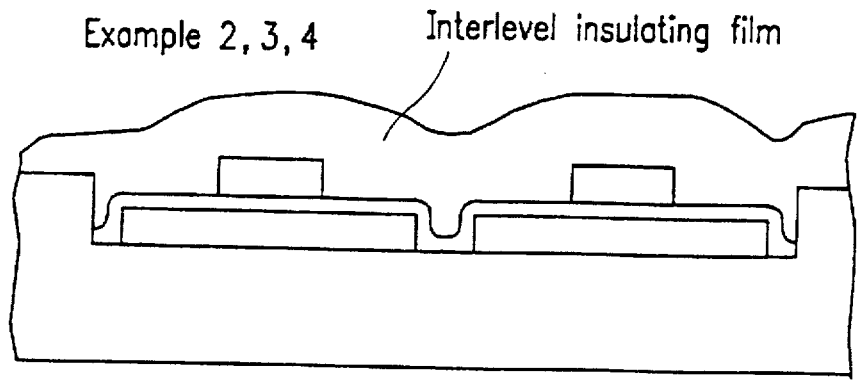

In Example 1, as shown in FIG. 14B, TFTs can be formed on both the upper portion and the lower portion of one step. Accordingly, two or more TFTs can be fabricated close to each other. On the other hand, in the other examples, one step is required for one TFT, so that the fabrication of the TFTs is more difficult. However, as shown in FIG. 14D, since the TFTs are fabricated so as to have the same height as each other, it is more advantageous to obtain a flat interlevel insulating layer as compared to Example 1 shown in FIG. 14C.

C. Productivity

As to Examples 1 and 4, since an insulating film is deposited on a seed, the productivity is decreased. On the other hand, as to Examples 2 and 3, since there is no need to deposit an insulating film in a process of forming a seed, the number of processes is decreased. Accordingly, excellent productivity is achieved.

As described above, according to the present invention, a second polycrystalline silicon film can be formed on an insulating substrate by controlling the crystal orientation and the positions of the grain boundaries. The second polycrystalline silicon film has large grains, and moreover, a TFT having a gate length suitable for practical use can be fabricated in a region having an uniform orientation without generating a short-channel effect.

When a channel region is formed by using the second polycrystalline silicon film so that the current path is formed in a direction perpendicular to the side of the step, the current path coincides with the direction of epitaxy growth (a lateral direction). Accordingly, a channel region including crystals having uniform orientation can be obtained without having grain boundaries in a direction of the current path. In this channel region, there are no defects which will cause a current barrier or a leakage current. Therefore, a TFT having high mobility (Nch:200 or more, Pch:180 or more) in which leakage current is small can be obtained.

As to a first polycrystalline silicon film used as a seed, it is sufficient to retain only the step portion and the periphery thereof having a uniform growth direction from the step, or the side wall at the step. Accordingly, the orientation of the seed and the region in which the seed is formed can be easily controlled. As a result, a polycrystalline silicon film and a TFT can be fabricated with excellent repeatability.

In the case where the step portion and the periphery thereof of the first polycrystalline silicon film are retained by selective etching, it is desirable to form an insulating film on the first polycrystalline silicon film prior to patterning so as to be simultaneously patterned. In this manner, only the influence of the orientation of the sides in a lateral direction can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for forming a polycrystalline silicon film comprising the steps of:

forming at least one step on a surface of an insulating substrate;

depositing a first amorphous silicon film on the substrate;

annealing the first amorphous silicon film so as to change the first amorphous silicon film into a first polycrystalline silicon film;

patterning the first polycrystalline silicon film to form a patterned film at the at least one step of the insulating substrate, the patterned film having at least one side face;

depositing a second amorphous silicon film on the insulating substrate so as to cover the patterned film; and annealing the second amorphous silicon film so as to change the second amorphous silicon film into a second polycrystalline silicon film by using the at least one side face of the pattered film as a seed crystal for lateral solid-phase crystallization.

2. A method for forming a polycrystalline silicon film according to claim 1, further comprising the step of forming an insulating film over the first polycrystalline silicon film prior to patterning the first polycrystalline silicon film.

3. A method for forming a polycrystalline silicon film according to claim 1, wherein forming the at least one step on the surface of the insulating substrate includes etching the insulating substrate to form at least one ridge portion on the surface of the insulating substrate.

4. A method for forming a polycrystalline silicon film according to claim 1, wherein forming the at least one step on the surface of the insulating substrate includes etching the insulating substrate to form at least one groove portion on the surface of the insulating substrate.

5. A method for forming a polycrystalline silicon film according to claim 1, wherein forming the at least one step on the surface of the insulating substrate includes etching the insulating substrate to form at least one concave portion on the surface of the insulating substrate.

6. A method for forming a polycrystalline silicon film according to claim 1, wherein patterning the first polycrystalline silicon film includes etching away a selected portion of the first polycrystalline silicon film so as to form the patterned film across the at least one step of the insulating substrate.

7. A method for forming a polycrystalline silicon film according to claim 1, wherein the at least one side face of the patterned film is parallel with at least one side face of the at least one step of the insulating substrate.

8. A method for forming a polycrystalline silicon film according to claim 1, wherein patterning the first polycrystalline silicon film includes etching back the first polycrystalline silicon film by an anisotropic etching so as to form the patterned film at the at least one side of the at least one step of the insulating substrate.

9. A method for fabricating a thin-film transistor comprising the steps of:

forming at least one step on a surface of an insulating substrate;

depositing a first amorphous silicon film on the substrate;

annealing the first amorphous silicon film so as to change the first amorphous silicon film into a first polycrystalline silicon film;

patterning the first polycrystalline silicon film to form a patterned film at the at least one step of the insulating substrate, the patterned film having at least one side face;

depositing a second amorphous silicon film on the insulating substrate so as to cover the patterned film;

annealing the second amorphous silicon film so as to change the second amorphous silicon film into a second polycrystalline silicon film by using the at least one side face of the pattered film as a seed crystal for lateral solid-phase crystallization; and forming a transistor including a channel region in the second polycrystalline silicon film, the channel region of the transistor being formed in such a manner that a current path of the channel region is perpendicular to at least one side face of the at least one step of the insulating substrate.

* * * * *